United States Patent
Lee (10) Patent No.: US 9,236,126 B2
(45) Date of Patent: Jan. 12, 2016

(54) SIMPLIFIED NONVOLATILE MEMORY CELL STRING AND NAND FLASH MEMORY ARRAY USING THE SAME

(71) Applicant: Seoul National University R&DB FOUNDATION, Seoul (KR)

(72) Inventor: Jong-Ho Lee, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 13/919,114

(22) Filed: Jun. 17, 2013

(65) Prior Publication Data

US 2014/0369126 A1    Dec. 18, 2014

(51) Int. Cl.
| | |
|---|---|
| G11C 16/04 | (2006.01) |
| H01L 29/423 | (2006.01) |
| H01L 29/788 | (2006.01) |
| H01L 29/792 | (2006.01) |
| H01L 27/115 | (2006.01) |
| H01L 29/08 | (2006.01) |

(52) U.S. Cl.
CPC ...... *G11C 16/0483* (2013.01); *H01L 27/11519* (2013.01); *H01L 27/11565* (2013.01); *H01L 29/0847* (2013.01); *H01L 29/4234* (2013.01); *H01L 29/42324* (2013.01); *H01L 29/7881* (2013.01); *H01L 29/792* (2013.01)

(58) Field of Classification Search
CPC ... G11C 16/04; G11C 16/0438; H01L 27/115
USPC ............................ 365/185.05, 185.06, 185.17
See application file for complete search history.

(56) References Cited

U.S. PATENT DOCUMENTS

| | | | | |
|---|---|---|---|---|
| 5,291,440 A | * | 3/1994 | Koyama | 365/185.17 |
| 5,295,096 A | * | 3/1994 | Nakajima | 365/185.28 |
| 5,524,094 A | * | 6/1996 | Nobukata et al. | 365/185.21 |
| 5,923,587 A | * | 7/1999 | Choi | 365/185.11 |
| 6,028,788 A | * | 2/2000 | Choi et al. | 365/185.11 |

(Continued)

FOREIGN PATENT DOCUMENTS

KR    100745766    7/2007

OTHER PUBLICATIONS

Lee et al., "NAND flash memory technology utilizing fringing electric field", Microelectronics Reliability, vol. 52, Issue 4, Apr. 2012, pp. 662-669.*

(Continued)

*Primary Examiner* — Hoai V Ho
*Assistant Examiner* — Muna A Techane
(74) *Attorney, Agent, or Firm* — Cantor Colburn LLP (57) ABSTRACT

A nonvolatile memory cell string includes two or more cell devices formed in series on a wall type semiconductor protruded from a semiconductor substrate with a predetermined length along one direction to form the cell string. One end of the cell string is electrically connected to outside through a string selection transistor formed on one end of the wall type semiconductor. The other end of the cell string is floated and not electrically connected to outside.

9 Claims, 8 Drawing Sheets

(56) References Cited

U.S. PATENT DOCUMENTS

| | | | |
|---|---|---|---|
| 6,046,940 A * | 4/2000 | Takeuchi et al. | 365/185.17 |
| 6,181,601 B1 * | 1/2001 | Chi | 365/185.18 |
| 6,222,769 B1 * | 4/2001 | Maruyama et al. | 365/185.17 |
| 6,809,985 B2 * | 10/2004 | Forbes et al. | 365/230.06 |
| 7,605,421 B2 * | 10/2009 | Ono | 257/315 |
| 2004/0109343 A1 * | 6/2004 | Proll et al. | 365/149 |
| 2006/0013041 A1 * | 1/2006 | Lin | 365/185.05 |
| 2007/0121376 A1 * | 5/2007 | Toda | 365/185.2 |
| 2007/0133273 A1 | 6/2007 | Liao et al. | |
| 2007/0201271 A1 * | 8/2007 | Kang | 365/185.05 |
| 2008/0080248 A1 * | 4/2008 | Lue et al. | 365/185.18 |
| 2008/0135920 A1 | 6/2008 | Liao et al. | |
| 2008/0259687 A1 * | 10/2008 | Specht et al. | 365/185.17 |
| 2008/0266949 A1 * | 10/2008 | He et al. | 365/185.05 |
| 2009/0052251 A1 * | 2/2009 | Kang et al. | 365/185.17 |
| 2010/0207208 A1 * | 8/2010 | Bedell et al. | 257/346 |
| 2011/0205801 A1 * | 8/2011 | Shiga | 365/185.18 |
| 2012/0309156 A1 * | 12/2012 | Ohgami | 438/299 |
| 2013/0277760 A1 * | 10/2013 | Lu et al. | 257/401 |
| 2013/0343130 A1 * | 12/2013 | Chen et al. | 365/185.17 |

OTHER PUBLICATIONS

Jeong et al., "High-Density Three-Dimensional Stacked NAND Flash with Common Gate Structure and Shield layer", IEEE Transactions on Electron Devices, vol. 58, No. 12, pp. 4212-4218 (2011).*

Jeong et al., "Novel 3-D Stacked NAND Flash String without Body Cross-Talk Effect", IEEE International Memory Workshop (IMW) 2010, pp. 1-2 (pp. 177-188).*

IEEE Lee et al "nand flash memory technology utilizing fringe electric field" Microelectronics Reliability, vol. 52, pp. 662-669 (2012). Lee et al.*

Jeong et al, IEEE "international Memory Workshop" (IMW) 2010, pp. 1-2 (pp. 177-178).*

Jeong et al. (IEEE International Memory Workshop (IMW) 2010, pp. 1-2 (pp. 177-178), hereinafter "Jeong").*

Lee et al. ("NAND flash memory technology utilizing fringe electric field", Microelectronics Reliability, vol. 52, pp. 662-669 (2012), available online Nov. 3, 2011, hereinafter "Lee").*

* cited by examiner

*Prior Art*

SIMPLIFIED NONVOLATILE MEMORY CELL STRING AND NAND FLASH MEMORY ARRAY USING THE SAME

BACKGROUND OF INVENTION

1. Field of the Invention

The present invention relates to a nonvolatile memory cell string and a NAND flash memory array using the same.

2. Description of the Related Art

To increase the degree of integration in a NAND flash memory etc., memory cell devices and structures of memory cell strings thereof connected in series have been continuously studied.

Among them, FinFET has been developed to overcome the problems of conventional plane-type devices such as a short channel effect (SCE), a low read current due to the leakage currents and a drain induced barrier lowering (DIBL) etc.

Though the FinFET structure can solve the problems of the above mentioned plane structure, it is always have another problem associated with a high integration because of a limitation in reducing width of a fin needed in one cell and that of oxide/nitride/oxide (ONO) layers formed on the both sides of the fin.

To solve the problem of the conventional FinFET structure, Korean Patent No. 10-0745766 (refer to patent reference 1) provides techniques for increasing the degree of integration by reducing the fin separation distance between adjacent cells through isolating two fin structures with a buried insulating layer and simply wrapping the two fins with a gate electrode interlaying a gate insulating layer.

By the way, the patent reference 1 shows that the isolated two fin structures interlaying a buried insulating layer forms adjacent cell strings and each cell string contains a plurality of cell devices and at least two switch devices. Two adjacent cell strings isolated by the buried insulting layer need a cell string contact pad having 3 times wider width than that of the conventional cell string and a common source line (CSL) contact pad on both end sides, respectively and it causes an loss of area. Especially, formation of the pads for contacting to metal interlaying the buried insulating layer with a narrow width causes a design rule matter and so it needs to consume more area.

Figure 6:
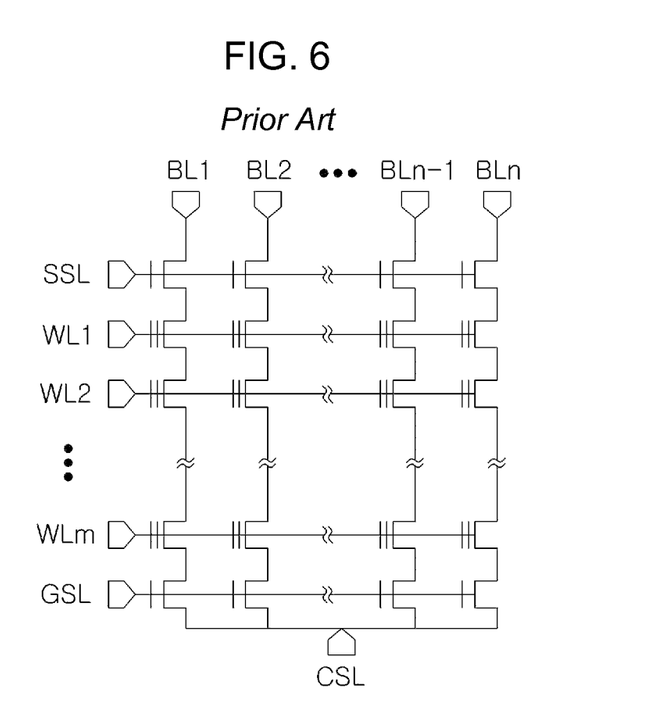
FIG. 6 is a circuit diagram showing a conventional NAND flash memory array.

And the conventional NAND flash memory array, as shown in FIG. 6, necessarily has a string selection line (SSL) for selecting cell string and a common source line (CSL) and a ground selection line (GSL) for selecting CSL on both sides of each memory string.

By the way, because SSL and GSL are conventionally formed to have a line width 4~5 times more than that of each word line (it means that selection transistors selected by SSL and GSL are formed with an area 4~5 times more than that of memory device formed by each word line), the area loss is one of reasons preventing a high integration.

The above mentioned problem takes place by reading a current flowing between a bit line connected to a specific cell string and CSL after being always turned on the selection transistors by SSL and GSL on reading any cell in the specific cell string of the conventional NAND flash memory.

SUMMARY OF THE INVENTION

The present invention is directed to provide a simplified memory cell string and a NAND flash memory array using the same by removing GSL and CSL necessarily needed in the conventional cell strings and NAND flash memory arrays through basically changing a reading method of any cell in a specific cell string of the conventional NAND flash memory.

To achieve the objective, a nonvolatile memory cell string according to the present invention comprises: two or more cell devices formed in series on a wall type semiconductor protruded from a semiconductor substrate with a predetermined length along one direction to form the cell string, wherein one end of the cell string is electrically connected to outside through a string selection transistor formed on one end of the wall type semiconductor, and wherein the other end of the cell string is floated and not electrically connected to outside.

Here, the wall type semiconductor can be formed with twin fins separated by a trench formed in a longitudinal direction with a predetermined depth from an upper part, and each of the twin fins can be alternatively formed with channel regions under gate electrodes of the two or more cell devices and the string selection transistor and a plurality of source/drain regions doped with a type of impurity opposite to the channel regions in the longitudinal direction.

Each of the gate electrodes can be extended to cover at least one of depletion regions formed between the channel and source regions and between the channel and drain regions.

The twin fins can be separated by a separation insulating layer filled up the inside of the trench and the separation insulating layer can be formed to protrude more than the twin fins. Insulating layers can be formed on the surface of the trench separating the twin fins and a shielding electrode can be filled between the insulating layers.

The shielding electrode can be electrically connected to the wall type semiconductor being in one body with the semiconductor substrate or can be formed of a semiconductor material doped with the same type impurity as the wall type semiconductor or a conductive material.

Each gate electrode of the two or more cell devices can be interlaid with a gate insulating layer stack containing a charge storage layer and can be formed in a transverse direction of the wall type semiconductor. The charge storage layer can be formed of one of a nitride, metal oxide, nano-particle and conductive material.

A NAND flash memory array according to the present invention comprises: a plurality of cell strings formed to have a predetermined length along one direction on a semiconductor substrate; a plurality of word lines formed to intersect each of the cell strings; a plurality of bit lines electrically connected to one end of each of the cell strings; and one or more string selection lines to select each of the cell strings, wherein each of the cell strings is formed on a wall type semiconductor protruded from the semiconductor substrate, wherein the string selection line is formed to intersect the wall type semiconductor at least by one side of the plurality of word lines, wherein each of the bit lines is electrically connected to one end of each of the cell strings exposed to one side of the string selection line, and wherein the other end of each of the cell strings is floated and not electrically connected to outside.

Here, the wall type semiconductor can be protruded with a predetermined interval on the semiconductor substrate and can be formed with twin fins separated by a trench formed in a longitudinal direction with a predetermined depth from an upper part. A shielding line can be further formed on inner side being interlaid with an insulating layer between the twin fins for forming a shielding electrode in each of the cell devices. The shielding line can be electrically connected to the semiconductor substrate.

Impurity doping layers can be formed in each of the twin fins between the word lines with a type of impurity opposite to channel regions of each of the cell strings and can be partially overlapped with each of the word lines.

The string select line (SSL) can be formed into a single line by one side of the plurality of word lines. Otherwise the string selection line can be formed into two lines by both sides of the plurality of word lines and each of the bit lines can be connected to one end of each of the cell strings exposed to one side of each string selection line by alternating with the each string selection line.

A nonvolatile memory cell string and a memory array using the same according to the present invention can be operated under the lower power than the conventional one by reading the current flowing between a bit line and a common body positively using a gate induced drain leakage (GIDL) known as a leakage current in the conventional switching devices instead of reading the current flowing between a bit line and a common source line (CSL) as like as the conventional read method and also significantly increase the degree of integration by removing GSL and CSL structures as a cause of the loss of area needed in the conventional cell strings and NAND flash memory arrays.

And cell devices embodied by the nonvolatile memory cell string and a memory array using the same according to the present invention can increase the degree of integration by separating a wall type semiconductor into two twin fins. And also the interference of adjacent cells can be basically prevented when a shielding electrode is used to separate.

In these drawings, the following reference numbers are used throughout: reference number 1 indicates a semiconductor substrate, 10, 91 and 92 a wall type semiconductor, 10a a channel region, 11 a depletion region, 12, 12', 14 and 14' a twin fin, 22 and 26 a source region, 24, 18 a drain region, 30 a separation means or a separation insulating layer, 32 an insulating layer, 40 an isolation insulating layer, 50, 52 a gate insulating layer stack, 60 a gate electrode or a word line, 62 a string selection line, 72, 72a, 74a, 76, 76a, 78a, 84 and 88 a bit line.

DETAILED DESCRIPTION

Detailed descriptions of preferred embodiments of the present invention are provided below with respect to accompanying drawings.

Embodiment for Nonvolatile Memory Cell String

A nonvolatile memory cell string according to the present invention comprises: two or more cell devices formed in series on a wall type semiconductor protruded from a semiconductor substrate with a predetermined length along one direction to form the cell string, wherein one end of the cell string is electrically connected to outside through a string selection transistor formed on one end of the wall type semiconductor, and wherein the other end of the cell string is floated and not electrically connected to outside.

Here, the cell devices can be devices having a conventional flat type channel structure or having a fin-shaped body for reducing a two-dimensional area more than the conventional flat type and increasing the area of a GIDL generating region.

At this time, the flat type channel structure means that a channel region of each of the cell devices is formed only on a top surface of the wall type semiconductor. If the channel region is formed on a top surface and side wall of the wall type semiconductor, the cell devices have a fin-shaped body structure.

Figure 1:
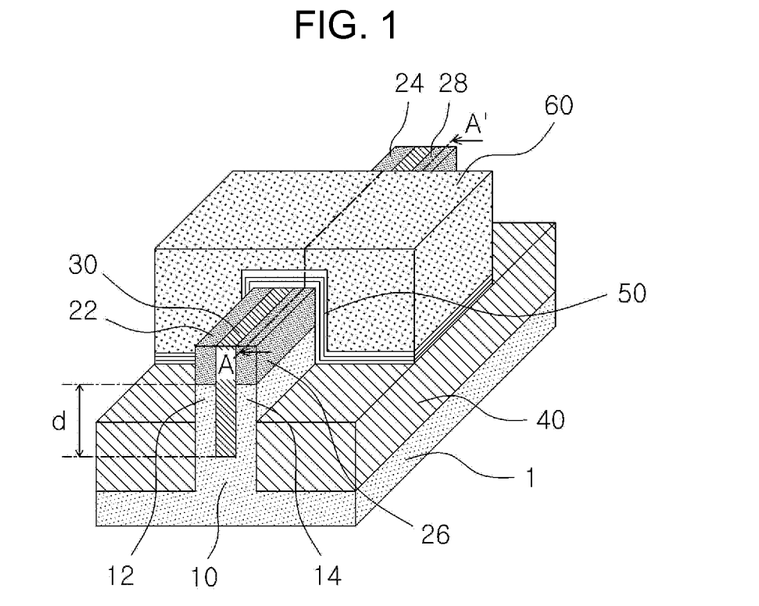
FIG. 1 is a perspective view showing a cell device structure of a nonvolatile memory cell string according to an embodiment of the present invention.
Figure 2:
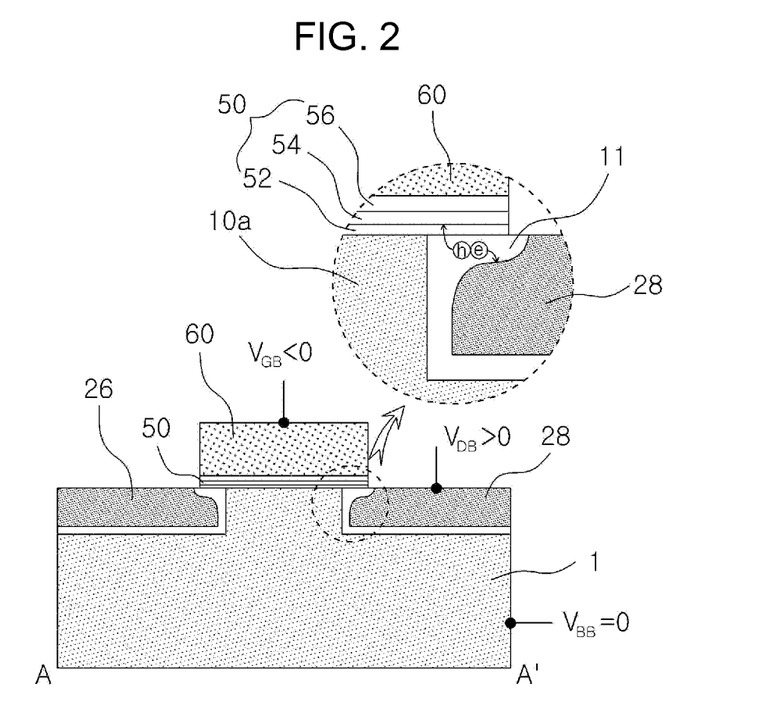
FIG. 2 is a cross sectional view taken along line A-A' in FIG. 1 and a partial enlarged view for explaining one of program operations.
Figure 3:
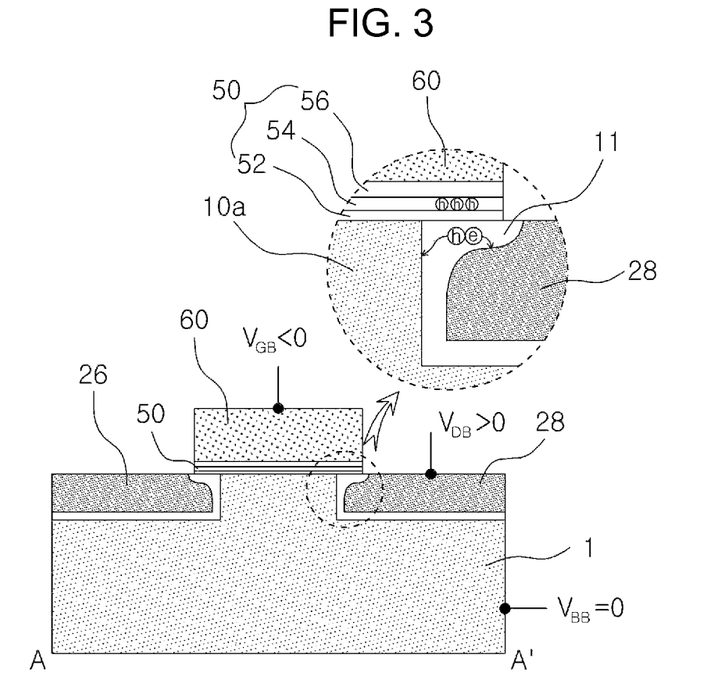
FIG. 3 is a cross sectional view taken along line A-A' in FIG. 1 and a partial enlarged view for explaining one of read operations.

An embodiment of an each cell device, as shown in FIGS. 1 to 3, is consisted of a wall type semiconductor 10 protruded from a semiconductor substrate, an isolation insulating layer 40 filled into a predetermined height of the wall type semiconductor, a gate insulating layer stack 50 containing a charge storage layer formed at least on both sides of the wall type semiconductor and on the isolation insulating layer and a gate electrode 60 formed to wrap the gate insulating layer stack.

And the wall type semiconductor 10 can be formed with twin fins 12 and 14 separated by a trench formed in a longitudinal direction that is vertical to the gate electrode 60 with a predetermined depth from an upper part. Each of the twin fins 12 and 14 can be alternatively formed with channel regions under gate electrodes of the cell devices and the string selection transistor and source/drain regions doped with a type of impurity opposite to the channel regions in the longitudinal direction.

At this time, junction depths of the source regions 22 and 26 and the drain regions 24 and 28 can be formed, as shown in FIG. 1, over an isolation insulating layer 40 or till a lower part of a separation insulating layer 30 (namely, it is possible to d=0).

And the gate electrode 60 is preferably extended to cover at least one of depletion regions formed between the channel region 10a and the source region 22 or 26 and between the channel region 10a and the drain region 24 or 28.

By the above mentioned embodiment, it can be possible to increase the degree of integration by separating a wall type semiconductor 10 into two twin fins 12 and 14 and also to perform a memory operation with low power using a gate induced drain leakage (GIDL).

In the conventional MOSFET type switch devices, a gate induced drain leakage (GIDL) is an OFF time current (namely, a leakage current in standby state) and tried to reduce to minimum, but one of main technical ideas in the present invention is to reversely and positively use GIDL for performing a memory operation.

For explaining program, erase and read operations, it is assumed that each cell device has an n-type MOSFET structure.

Program Operation

As like as the conventional method, in a program inhibition state of all cell strings except a target cell string, the program in the target cell string can be performed by the Fowler-Nordheim (FN) tunneling generated by applying a voltage to a gate electrode connected to a target word line.

Erase Operation

As like as the conventional method, an erase can be optionally operated by the FN tunneling induced by applying a voltage to a gate electrode of a cell connected to the target word line. And another erase can be operated by the FN tunneling induced by applying a voltage to a body forming a channel, in this case, all cells connected to the body are erased at once.

Another method of erase operation, among n+ regions (equivalently source and drain regions of NMOS device) formed in bodies of the right and left sides of a gate electrode of a specific cell, a region near to a bit line and overlapped with the gate electrode can be optionally erased. Namely, it is a kind of bit erasing. For example, as shown in FIG. 2, when a body 1 of a p-type semiconductor substrate is applied with a reference voltage (e.g., a ground, $V_{BB}=0$), a drain region 28 formed with an n-type impurity doping layer is applied with a positive voltage ($V_{DB}>0$), and a gate electrode 60 is applied with a negative voltage ($V_{GB}<0$), a reversed bias is applied between a p-type body 10 and an n-type drain region 28 and between a p-type channel region 10a and an n-type drain region 28. The reversed bias increases a depletion region 11 of a pn-junction interface.

At this time, as like as this embodiment, when the gate electrode 60 is formed on the depletion region and a negative voltage ($V_{GB}<0$) is applied to the gate electrode 60, the depletion region 11, as shown in FIG. 2, is expanded into a part of an upper side of an n-type drain region 28 located at lower part of a gate electrode 60.

And a band bending occurs at a depletion region 11 between a gate electrode 60 applied with a negative voltage ($V_{GB}<0$) and a drain region 28 applied with a positive voltage ($V_{DB}>0$). As a result, because electrons of semiconductor material in a depletion region 11 obtain a high probability of tunneling from the valance band to the conduction band, as a partial enlarged view shown in FIG. 2, an electron-hole generation is generated at a depletion region 11 under a lower part of a gate electrode 60.

Electrons generated by the electron-hole generation are moved into a drain region 28 applied with a positive voltage ($V_{DB}>0$). Holes generated by the electron-hole generation are accelerated toward a gate electrode 60 applied with a negative voltage ($V_{GB}<0$) and injected into a charge storage layer 54 of a gate insulating layer stack 50. As a result, an erase operation is completed.

Read Operation

As shown in FIG. 3, a read operation can be operated by using the fact when holes are injected into a charge storage layer 54 of a gate insulating layer stack 50 through a bit erasing, a size of a GIDL current flowing between a drain region 28 and a body 1 of a semiconductor substrate is reduced due to a slow band bending at a depletion region 11 under a lower part of a gate electrode 60.

If holes are stored by the FN tunneling, a size of a GIDL current can be reduced as mentioned above and the reduced size can be also sensed by a read operation. Reversely, when electrons are stored by a FN tunneling, the GIDL current is increased.

In other words, when a read voltage such as a specific negative voltage ($V_{GB}<0$) is applied to a gate electrode 60, a size of a GIDL current flowing between a bit line electrically connected to a drain region 28 and a body 1 of a semiconductor substrate can be sensed. By this process, a storage state of a specific cell can be read.

As mentioned above, this embodiment differs from the conventional MODFET switching device and needs a structure for generating a large GIDL phenomenon. Thus, at least one of the source region 22 or 26 and the drain region 24 or 28 is preferably partially overlapped with the gate electrode 60. By a fabricating process, as shown in FIGS. 2 and 3, the source regions 22 and 26 and the drain regions 24 and 28 can be partially overlapped with the gate electrode 60.

Since each cell device can be operated as the mentioned above, it is possible to be operated as a nonvolatile memory cell string even though one end of the cell string is floated and not electrically connected to outside as followings: when the cell string is consisted of a wall type semiconductor 10 expanded to have a predetermined length in one direction on a semiconductor substrate and two or more cell devices having an above mentioned structure formed in series along a longitudinal direction of the wall type semiconductor, one end of the cell string is electrically connected to outside through string selection transistors (transistors by SSL) formed on one end of the wall type semiconductor 10 and the other end of the cell string is floated and not electrically connected to outside.

Hereby, an area of the cell sting according to this embodiment can be reduced more than that of the conventional one because a selection transistor is only provided on one end of the cell string instead of on both ends needed in the conventional one.

The above mentioned embodiment can be used as a base for applying various shapes, below the detailed examples are briefly described with respect to accompanying drawings.

Figure 4:
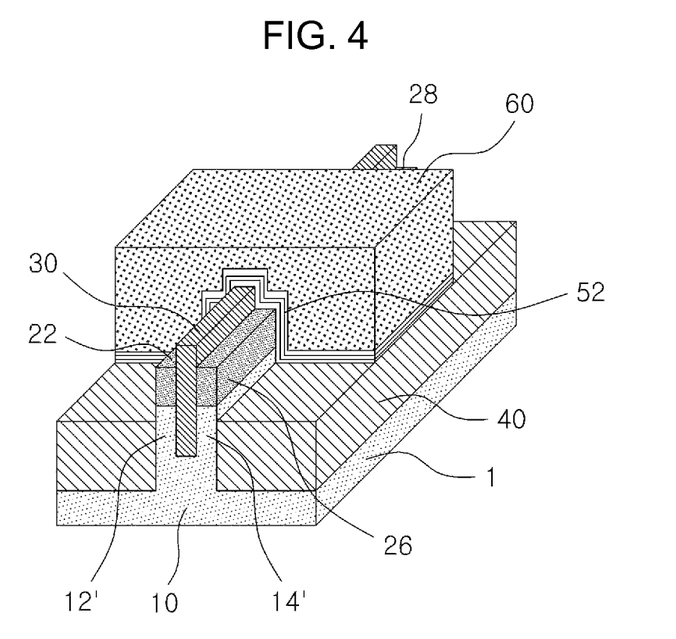
FIGS. 4 and 5 are perspective views showing some cell device structures of nonvolatile memory cell strings according to some embodiments of the present invention.

First, as shown in FIG. 4, a separation insulating layer 30 formed between the twin fins 12 and 14, unlike shown in FIG. 1, can be protruded more than twin fins 12 and 14 at both sides.

By the above embodiment, a route of a gate insulating layer stack 52 wrapping the twin fins 12 and 14 and a separation insulating layer 30 can be increased to inhibit the movement of charges from a charge storage layer of one fin to a charge storage layer of the other fin more than that of the case shown in FIG. 1.

Figure 5:
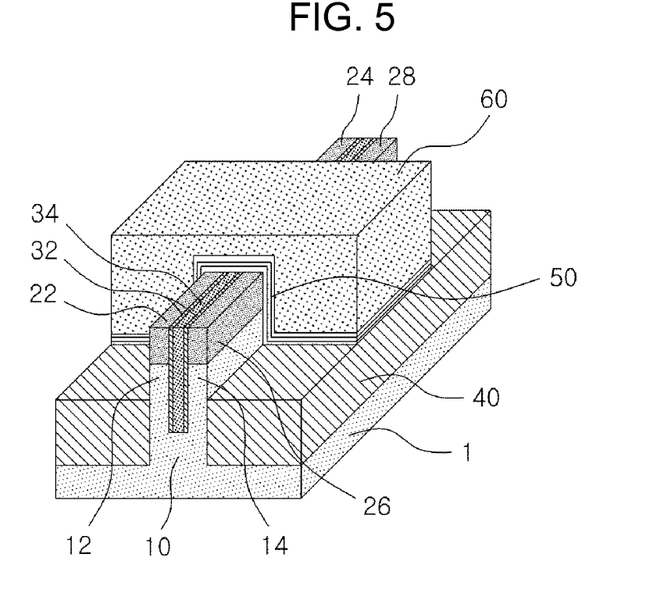

On the other hand, as shown in FIG. 5, instead of the separation insulating layer 30, insulating layers 32 are formed at least on side walls of the trench separating the twin fins 12 and 14 and a shielding electrode 34 is filled between the insulating layers 32.

At this time, the shielding electrode 34 can be formed by semiconductor materials (e.g., a poly silicon, amorphous silicon etc.) doped with an impurity which is the same type (e.g., a P-type) as the wall type semiconductor 10 formed in one body with the semiconductor substrate or conductive materials (e.g., metal etc.). By this embodiment, the interference of adjacent cells can be basically prevented.

Additionally, the shielding electrode 34 can be electrically connected to a wall type semiconductor 10 formed in one body with semiconductor substrate. By this structure, a body contact for memory cell operation can be formed on the shielding electrode 34.

And the gate insulating layer stack 50, as an enlarged view shown in FIG. 2, can be consisted of the charge storage layer 54 formed between two insulating layers, namely, a tunneling insulating layer 52 and a blocking insulating layer 56, and the charge storage layer 54 can be formed of one selected from a nitride, metal oxide, nano-particle and conductive material.

Embodiment for NAND Flash Memory Array

Next, detailed descriptions of embodiments of an NAND flash memory array using the nonvolatile memory cell string are provided below with respect to FIGS. 7 to 12.

Figure 7:
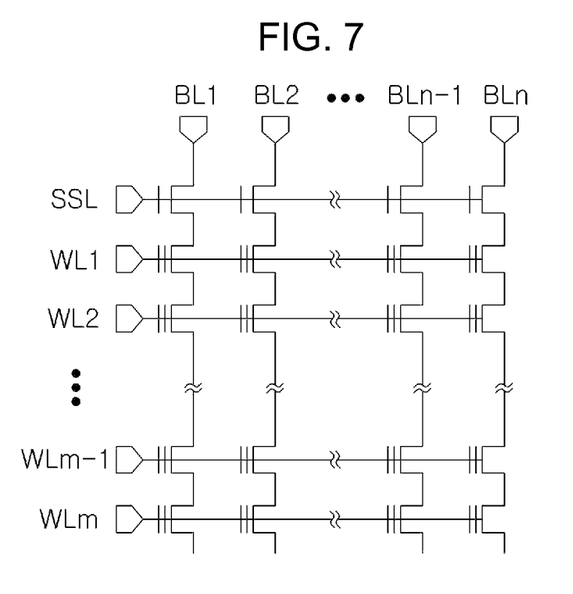
FIGS. 7 and 8 are circuit diagrams showing NAND flash memory arrays according to some embodiments of the present invention.
Figure 8:
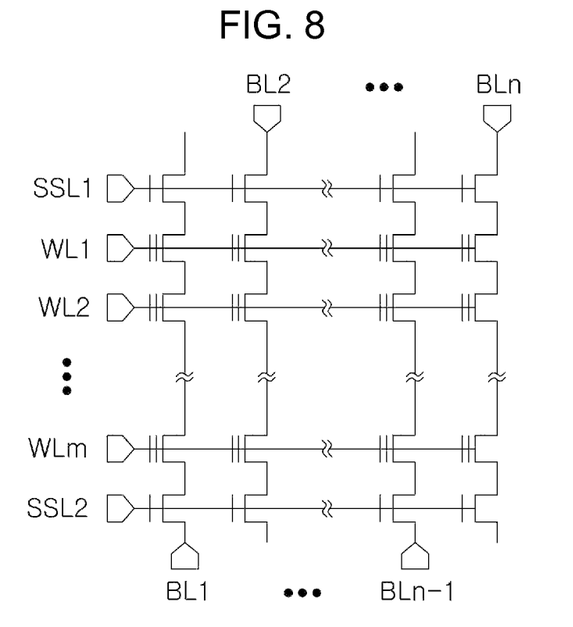

FIGS. 7 and 8 are circuit diagrams of memory arrays composed of cell strings according to the embodiments. The circuit structures, as above mentioned in embodiment for a cell string, can be applied not only to a cell device, as mentioned later, for reducing the area of a two-dimensional cell and using GIDL efficiently, but also to a cell device having a conventional flat type channel structure.

Figure 9:
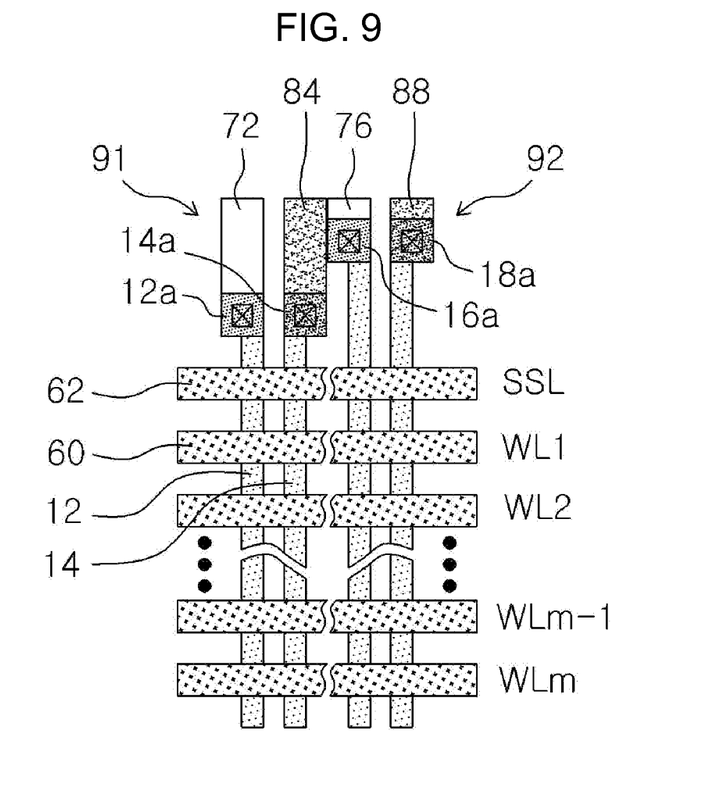
FIGS. 9 and 10 are layouts showing NAND flash memory array structures embodied by embodiments of the present invention according to FIG. 7.
Figure 10:
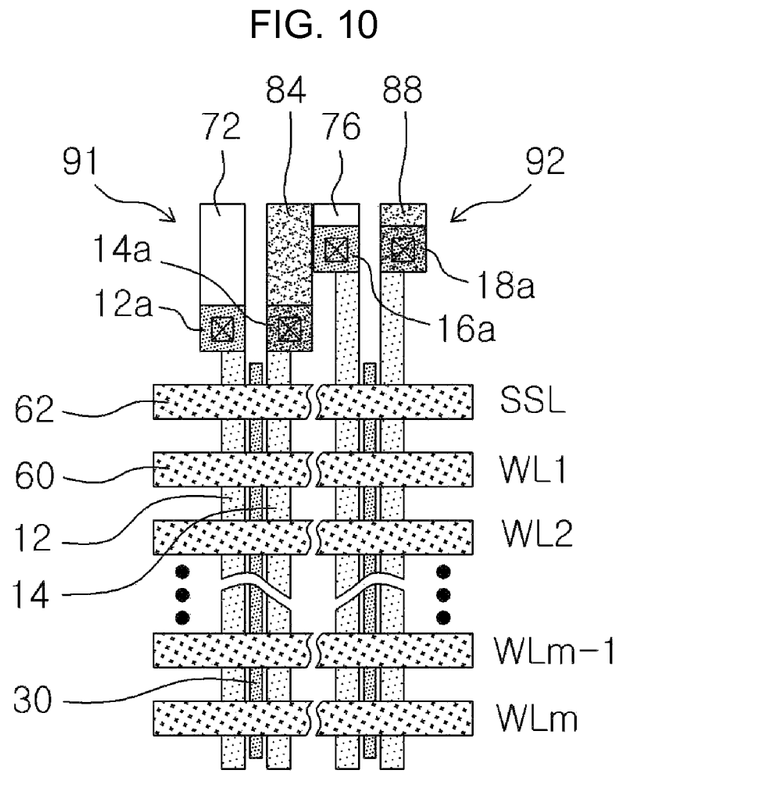
Figure 11:
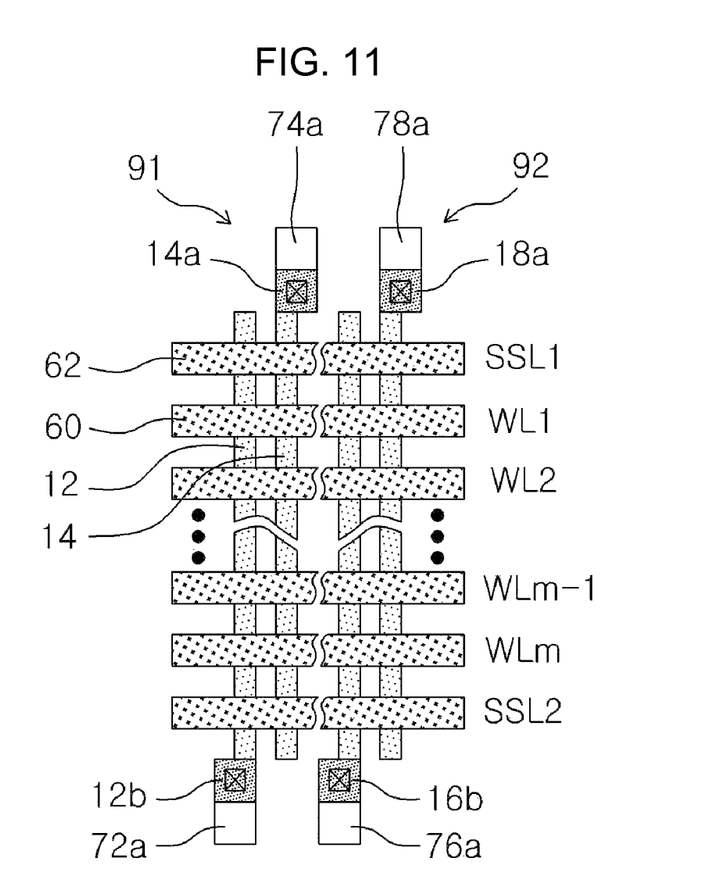
FIGS. 11 and 12 are layouts showing NAND flash memory array structures embodied by embodiments of the present invention according to FIG. 8.

FIGS. 9 and 10 are layouts showing NAND flash memory array structures embodied by embodiments of the present invention according to FIG. 7. And FIGS. 11 and 12 are layouts showing NAND flash memory array structures embodied by embodiments of the present invention according to FIG. 8.

A NAND flash memory array according to the present embodiment basically comprising: a plurality of cell strings formed to have a predetermined length along one direction on a semiconductor substrate 1; a plurality of word lines 60 (for example, WL1, WL2, . . . , WLm-1, WLm) formed to intersect each of the cell strings; a plurality of bit lines 72, 72a, 74a, 76, 76a, 78a, 84 and 88 (for example, BL1, BL2, . . . , BLn-1, BLn) electrically connected to one end of each of the cell strings; and one or more string selection line 62 (SSL) to select each of the cell strings.

Here, the cell strings, as shown in FIGS. 1, 9 to 12, can be formed on a plurality of wall type semiconductors 10, 91 and 92 protruded from the semiconductor substrate 1 and each wall type semiconductor can be formed with twin fins 12 and 14 separated by a trench formed in a longitudinal direction of the wall type semiconductor with a predetermined depth from an upper part. As a result, each of the cell strings can be formed along each of the twin fins 12 and 14.

Figure 12:
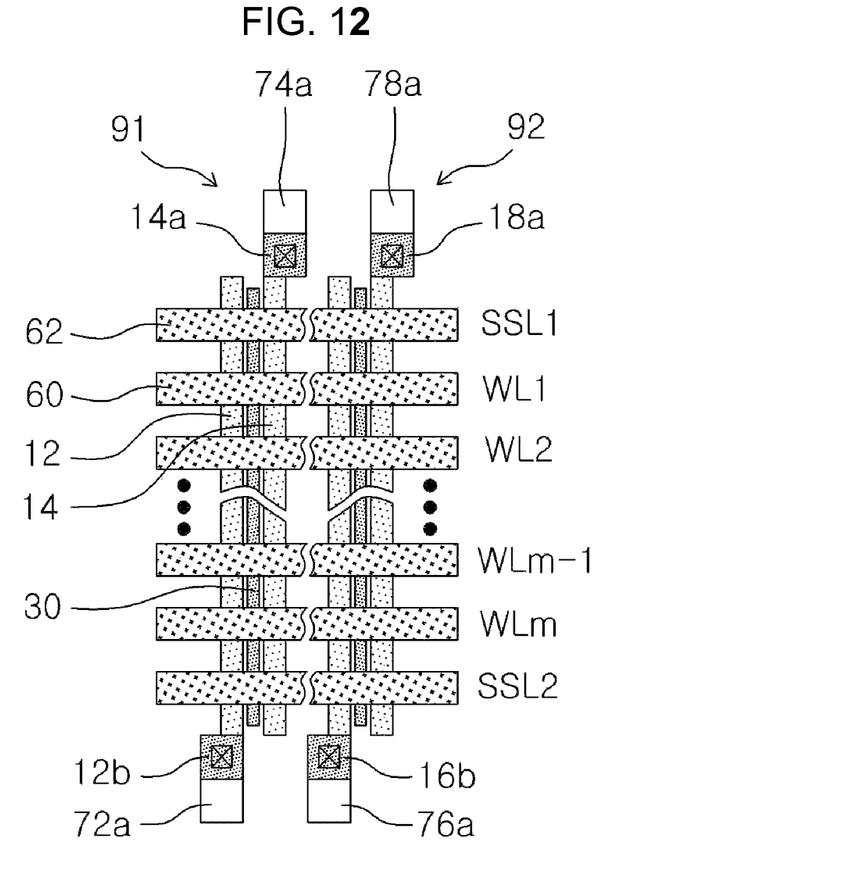

As shown in FIGS. 5, 10 and 12, shielding lines 30 can be further formed between the twin fins 12 and 14 interlaid with an insulating layer 32 for forming a shielding electrode 34 in each cell device. At this time, the shielding lines 30 can be electrically connected to the semiconductor substrate 1.

And impurity doping layers 22, 24, 26 and 28 are formed in each of the twin fins 12 and 14 between the word lines with a type of impurity opposite to channel regions of each of the cell strings and partially overlapped with each of the word lines 60.

The string selection line 62 can be formed, as shown in FIGS. 7, 9 and 10, with a single line (SSL) crossing the wall type semiconductor 10, 91 and 92 by one side of the plurality of word lines 60 (WL1, WL2, . . . , WLm-1, WLm) or formed, as shown in FIGS. 8, 11 and 12, with two lines (SSL1, SSL2) by both sides of the plurality of word lines 60 (WL1, WL2, . . . , WLm-1, WLm).

Each of the plurality of bit lines 72, 72a, 74a, 76, 76a, 78a, 84 and 88 (BL1, BL2, . . . , BLn-1, BLn) is electrically connected to one end of each cell string 12 or 14 exposed to one side of the string selection line 60 and the other end of each cell string 12 or 14 is floated and not electrically connected to outside.

In other words, when the string selection line 62, as shown in FIGS. 7, 9 and 10, can be formed with a single line (SSL) by one side of the plurality of word lines 60 (WL1, WL2, . . . , WLm-1, WLm), each bit line 72, 76, 84 or 88 can be connected by a contact pad 12a, 14a, 16a or 18a to one end of each cell string 12 or 14 exposed to one side of the string selection line SSL. And the other end of each cell string 12 or 14 which is not connected to each bit line is floated and not electrically connected to outside.

On the other hand, when the string selection line 62, as shown in FIGS. 8, 11 and 12, is formed with two lines (SSL1, SSL2) by both sides of the plurality of word lines 60 (WL1, WL2, . . . , WLm-1, WLm), each bit line 72a, 74a, 76a or 78a can be connected by a contact pad 12b, 14a, 16b or 18a to one end of each cell string 12 or 14 exposed to one side of the string selection lines (SSL1 and SSL2) by alternating with each string selection line (SSL1 or SL2). And the other end of each cell string 12 or 14 which is not connected to each bit line is floated and not electrically connected to outside.

In the former embodiment, as shown in FIGS. 9 and 10, when each bit line 72, 76, 84 or 88 is connected to one end of each cell string 12 or 14 through a single string selection line (SSL) from one side of a plurality of word lines, the bit lines 72, 76, 84 and 88 can be formed on different layers to avoid leakage currents between adjacent bit lines. For example, bit lines 72 and 76 can be formed on a down layer; bit lines 84 and 88 can be formed on an upper layer.

By the above mentioned composition, GSL and CSL required necessarily in the conventional NAND flash memory array shown in FIG. 6 can be removed and reduce area consumption to increase the degree of integration.

Next, with respect to FIG. 9, an operation method of each memory cell is briefly explained. Since operation methods of embodiments according to FIGS. 10 to 12 are similar to that of an embodiment according to FIG. 9, the description is omitted.

First, in order to program or read a specific cell, a pass voltage enough to turn on the target memory cells are applied to word lines located between a word line passing the specific cell and a string select line (SSL).

And at a FN programming, a program voltage (e.g., when each cell is an n-type MOS device having a p-type body, $V_{PGM}>0$) is applied to a word line passing a specific cell. At a read operation, a read voltage (e.g., when each cell is an n-type MOS device, $0<|V_{READ}|<V_{PGM}$) is applied to a word line passing a specific cell. In program operation, cell strings crossed to a word line passing a specific cell but inhibiting programming can boost the potential of each fin body by boosting effect.

On the other hand, a cell string having a specific cell to be a program is biased to supply sufficient electrons from a connected bit line to a channel formed in a fin body region.

An FN erase operation can be performed by applying with a positive voltage to a common region connected with all fin bodies in a group of cell string arrays. At this time, word lines in the target array can be applied with a biased voltage for a smooth erase operation.

In the mentioned above, the program and erase operations are explained according to FN method, but other program or erase method can also be applied.

By the above mentioned operations, GSL and CSL which are necessarily needed in the conventional NAND flash memory array are not needed any more. Thus, the operation has an advantage that the degree of integration of a memory array according to the present invention can be significantly increased more than that of the conventional one.

What is claimed is:

1. A nonvolatile memory cell string comprising:
   two or more cell devices formed in series on a wall type semiconductor protruded from a semiconductor substrate with a predetermined length along one direction to form the cell string, wherein one end of the cell string is electrically connected to outside through a string selection transistor formed on one end of the wall type semiconductor, wherein the other end of the cell string is floated and not electrically connected to outside, wherein the wall type semiconductor is formed with twin fins separated by a trench formed in a longitudinal direction with a predetermined depth from an upper part, wherein each of the twin fins is alternatively formed with channel regions under gate electrodes of the two or more cell devices and the string selection transistor and a plurality of source/drain regions doped with a type of impurity opposite to the channel regions in the longitudinal direction, wherein insulating layers are formed on side walls of the trench separating the twin fins and a shielding electrode is filled between the insulating layers, and wherein a bottom of the shielding electrode is directly contacted with the wall type semiconductor, the shielding electrode being electrically connected to the wall type semiconductor formed in one body with the semiconductor substrate.

2. The nonvolatile memory cell string of claim 1, wherein the shielding electrode is formed of a semiconductor material doped with the same type impurity as the wall type semiconductor or a conductive material.

3. The nonvolatile memory cell string of claim 1, wherein the gate electrode is interlaid with a gate insulating layer stack containing a charge storage layer and formed in a transverse direction of the wall type semiconductor, and wherein the charge storage layer is formed of one of a nitride, metal oxide, nano-particle and conductive material.

4. A NAND flash memory array comprising:

a plurality of cell strings formed to have a predetermined length along one direction on a semiconductor substrate;

a plurality of word lines formed to intersect each of the cell strings;

a plurality of bit lines electrically connected to one end of each of the cell strings; and one or more string selection lines to select each of the cell strings, wherein each of the cell strings is formed on a wall type semiconductor protruded from the semiconductor substrate, wherein the string selection line is formed to intersect the wall type semiconductor at least by one side of the plurality of word lines, wherein each of the bit lines is electrically connected to one end of each of the cell strings exposed to one side of the string selection line, wherein the other end of each of the cell strings is floated and not electrically connected to outside, wherein the wall type semiconductor is protruded with a predetermined interval on the semiconductor substrate and formed with twin fins separated by a trench formed in a longitudinal direction with a predetermined depth from an upper part, wherein a shielding line is further formed between insulating layers formed on side walls of the trench for forming a shielding electrode in each of the cell devices, and wherein a bottom of the shielding line is directly contacted with the wall type semiconductor, the shielding line being electrically connected to the semiconductor substrate.

5. The NAND flash memory array of claim 4, wherein impurity doping layers are formed in each of the twin fins between the word lines with a type of impurity opposite to channel regions of each of the cell strings and partially overlapped with each of the word lines.

6. The NAND flash memory array of claim 4, wherein the string selection line is formed into a single line by one side of the plurality of word lines.

7. The NAND flash memory array of claim 5, wherein the string selection line is formed into a single line by one side of the plurality of word lines.

8. The NAND flash memory array of claim 4, wherein the string selection line is formed into two lines by both sides of the plurality of word lines, and wherein each of the bit lines is connected to one end of each of the cell strings exposed to one side of each string selection line by alternating with the each string selection line.

9. The NAND flash memory array of claim 5, wherein the string selection line is formed into two lines by both sides of the plurality of word lines, and wherein each of the bit lines is connected to one end of each of the cell strings exposed to one side of each string selection line by alternating with the each string selection line.

* * * * *